US012027623B2

(12) United States Patent
Paul et al.

(10) Patent No.: US 12,027,623 B2
(45) Date of Patent: *Jul. 2, 2024

(54) HIGH VOLTAGE SWITCHING DEVICE

(71) Applicant: Murata Manufacturing Co., Ltd., Kyoto (JP)

(72) Inventors: Abhijeet Paul, Poway, CA (US); Simon Edward Willard, Irvine, CA (US); Alain Duvallet, San Diego, CA (US)

(73) Assignee: Murata Manufacturing Co., Ltd, Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/167,992

(22) Filed: Feb. 4, 2021

(65) Prior Publication Data
US 2021/0234043 A1     Jul. 29, 2021

Related U.S. Application Data

(63) Continuation of application No. 16/431,155, filed on Jun. 4, 2019, now Pat. No. 10,923,592, which is a
(Continued)

(51) Int. Cl.
*H01L 29/78*     (2006.01)
*H01L 21/74*     (2006.01)
(Continued)

(52) U.S. Cl.
CPC ........ *H01L 29/7838* (2013.01); *H01L 21/743* (2013.01); *H01L 21/84* (2013.01);
(Continued)

(58) Field of Classification Search
CPC .......... H01L 29/66659; H01L 29/7824; H01L 29/7835
See application file for complete search history.

(56) References Cited

U.S. PATENT DOCUMENTS 7,230,302 B2    6/2007   Lotfi et al.
7,405,443 B1    7/2008   Zuniga
(Continued)

OTHER PUBLICATIONS

Gheyas, Syed I., Office Action received from the USPTO dated Jun. 28, 2018 for U.S. Appl. No. 15/832,626, 20 pgs.
(Continued)

*Primary Examiner* — Syed I Gheyas
(74) *Attorney, Agent, or Firm* — JAQUEZ LAND GREENHAUS & McFARLAND LLP; John Land, Esq.

(57) ABSTRACT

A high-voltage switching device that can be fabricated in a standard low-voltage process, such as CMOS, and more specifically SOI CMOS. Embodiments include integrated circuits that combine, in a unitary structure, a FET device and an integrated, co-fabricated modulated resistance region (MRR) controlled by one or more Voltage-Drop Modulation Gates (VDMGs). The VDMGs are generally biased independently of the gate of the FET device, and in such a way as to protect each VDMG from excessive and potentially destructive voltages. In a first embodiment, an integrated circuit high voltage switching device includes a transistor structure including a source, a gate, and an internal drain; an MRR connected to the internal drain of the transistor structure; at least one VDMG that controls the resistance of the MRR; and a drain electrically connected to the MRR. Each VDMG at least partially depletes the MRR upon application of a bias voltage.

27 Claims, 7 Drawing Sheets

Related U.S. Application Data continuation of application No. 15/832,626, filed on Dec. 5, 2017, now Pat. No. 10,319,854.

(51) Int. Cl.
| | |
|---|---|
| *H01L 21/84* | (2006.01) |
| *H01L 27/12* | (2006.01) |
| *H01L 29/10* | (2006.01) |
| *H01L 29/40* | (2006.01) |
| *H01L 29/66* | (2006.01) |
| *H01L 29/786* | (2006.01) |
| *H01L 29/06* | (2006.01) |
| *H01L 29/08* | (2006.01) |
| *H01L 29/423* | (2006.01) |

(52) U.S. Cl.
CPC ...... *H01L 27/1203* (2013.01); *H01L 29/1083* (2013.01); *H01L 29/1087* (2013.01); *H01L 29/404* (2013.01); *H01L 29/66484* (2013.01); *H01L 29/7824* (2013.01); *H01L 29/7831* (2013.01); *H01L 29/78606* (2013.01); *H01L 29/78624* (2013.01); *H01L 29/0692* (2013.01); *H01L 29/0878* (2013.01); *H01L 29/4238* (2013.01)

(56) References Cited

U.S. PATENT DOCUMENTS

| | | | |
|---|---|---|---|
| 7,638,380 B2 | 12/2009 | Pearce | |
| 7,719,343 B2 | 5/2010 | Burgener et al. | |
| 7,829,945 B2 | 11/2010 | Adkisson et al. | |
| 7,890,891 B2 | 2/2011 | Stuber et al. | |
| 7,910,993 B2 | 3/2011 | Brindle et al. | |
| 8,686,787 B2 | 4/2014 | Swonger | |
| 9,093,523 B2 | 7/2015 | Takahashi | |
| 9,264,053 B2 | 2/2016 | Englekirk | |
| 9,413,362 B2 | 8/2016 | Englekirk | |
| 9,837,412 B2 | 12/2017 | Tasbas et al. | |
| 10,319,854 B1 | 6/2019 | Paul et al. | |
| 10,923,592 B2 | 2/2021 | Paul et al. | |
| 2012/0098063 A1* | 4/2012 | Tsai | H01L 29/4933 257/E21.409 |
| 2017/0346477 A1 | 11/2017 | Xia | |
| 2018/0076715 A1 | 3/2018 | Moffat et al. | |
| 2019/0172948 A1 | 6/2019 | Paul et al. | |
| 2019/0288113 A1 | 9/2019 | Paul et al. | |

OTHER PUBLICATIONS

Gheyas, Syed I., Notice of Allowance received from the USPTO dated Jan. 28, 2019 for U.S. Appl. No. 15/832,626, 13 pgs.
Paul, et al., Preliminary Amendment filed in the USPTO dated Feb. 26, 2018 for U.S. Appl. No. 15/832,626, 5 pgs.
Paul, et al., Response filed in the USPTO dated Oct. 29, 2018 for U.S. Appl. No. 15/832,626, 11 pgs.
Goktepeli, et al., "Improvement of Switch Device Performance Through Utilization of Offset Spacers", patent application filed in the USPTO on Oct. 23, 2015, U.S. Appl. No. 14/921,976, 51 pgs.
Pritiskutch, et al., "Understanding LDMOS Device Fundamentals", STMicroelectronics, AN1226 Application Note, Jul. 2000, 4 pgs.
Gheyas, Syed I., Office Action received from the USPTO dated Dec. 31, 2019 for U.S. Appl. No. 16/431,155, 19 pgs.
Gheyas, Syed I., Final Office Action received from the USPTO dated Apr. 16, 2020 for U.S. Appl. No. 16/431,155, 14 pgs.
Gheyas, Syed I., Advisory Action received from the USPTO dated Sep. 1, 2020 for U.S. Appl. No. 16/431,155, 4 pgs.
Gheyas, Syed I., Notice of Allowance received from the USPTO dated Oct. 8, 2020 for U.S. Appl. No. 16/431,155, 15 pgs.
PSemi Corporation, Response filed in the USPTO dated Mar. 30, 2020 for U.S. Appl. No. 16/431,155, 9 pgs.
PSemi Corporation, Response filed in the USPTO dated Aug. 25, 2020 for U.S. Appl. No. 16/431,155, 10 pgs.

* cited by examiner

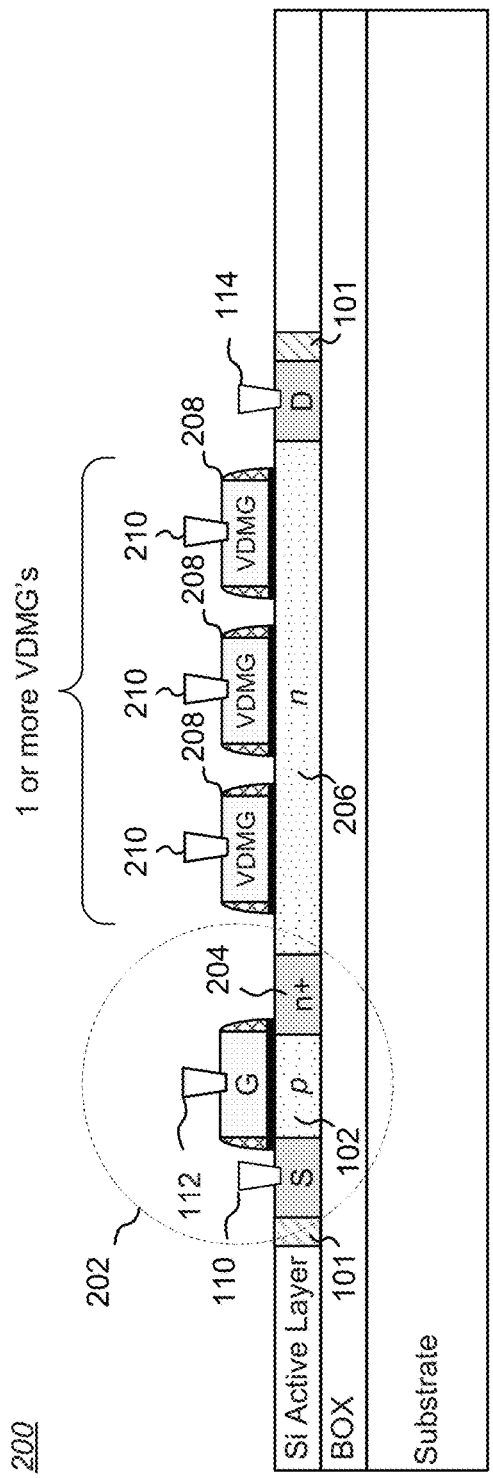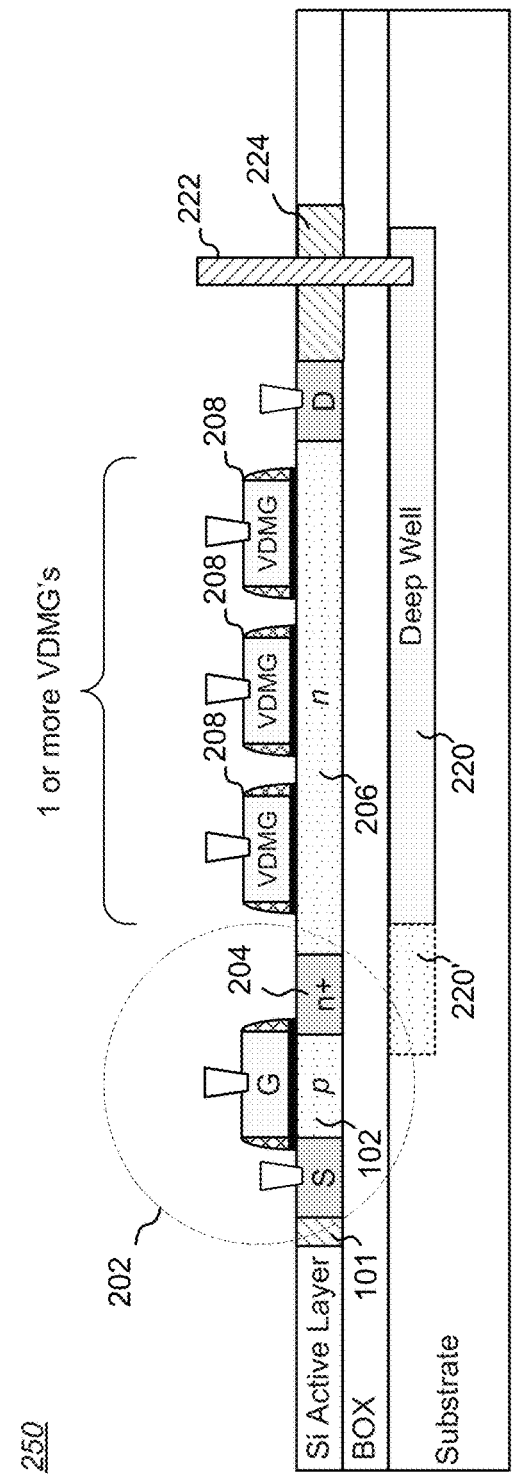
FIG. 2A
FIG. 2B

400

Fabricating, in a unitary structure, (1) a FET transistor structure having a source, a gate, and an internal drain, (2) an integrated, co-fabricated modulated resistance region coupled to the internal drain and controlled by one or more voltage-drop modulation gates, and (3) a drain — 402

FIG. 4

HIGH VOLTAGE SWITCHING DEVICE

CROSS REFERENCE TO RELATED APPLICATIONS—CLAIM OF PRIORITY

This application is a continuation of commonly owned and co-pending U.S. patent application Ser. No. 16/431,155 filed Jun. 4, 2019, entitled "High Voltage Switching Device", the disclosure of which is incorporated herein by reference in its entirety. application Ser. No. 16/431,155 is a continuation of commonly owned U.S. patent application Ser. No. 15/832,626 filed Dec. 5, 2017, entitled "High Voltage Switching Device", now U.S. Pat. No. 10,319,854 issued Jun. 11, 2019, the disclosure of which is incorporated herein by reference in its entirety.

(1) TECHNICAL FIELD

Background

This invention relates to electronic switching devices, and more particularly to high voltage switching devices.

(2) BACKGROUND

Many electronic products, particularly mobile computing and/or communication products (e.g., notebook computers, ultra-book computers, and tablet devices), use high voltage DC power sources. Examples of such DC power sources are lithium ion (Li-Ion) and nickel metal hydride (NiMH) batteries, which may have DC voltages ranging from 6-100V. However, system electronics generally require much lower voltages (typically 1-5V) to operate.

It is common to use a variety of circuits, such as DC-to-DC step-down converters, to generate intermediate and/or low voltage levels from a higher voltage DC power source; such circuits are typically characterized by their output-to-input voltage conversion ratio, $V_{OUT}$:$V_{IN}$.

The well-known DC-to-DC step-down converter is also known as a "buck" converter, because $V_{OUT}$ is less than $V_{IN}$, and hence the converter is "bucking" the input voltage rather than boosting the input voltage such that $V_{OUT}$ is greater than $V_{IN}$, as is the case with DC-to-DC step-up converters. Both types of DC-to-DC converters work on the same principle: an array of electronic switches charges capacitors or inductors in series or parallel, and then switches them into other configurations to create the desired output voltage. Examples of DC-to-DC converters are set forth in co-pending U.S. patent application Ser. No. 15/266,784, filed Sep. 15, 2016, entitled "Current Protected Integrated Transformer Driver for Isolating a DC-DC Convertor", the contents of which are hereby incorporated by reference.

A requirement of all DC/DC step-down converter switches is to withstand application of a high supply voltage, which is typically done in one of two ways: (1) either utilize switches that are specially designed to withstand high voltage and/or which are fabricated in a technology that allows such switches to inherently withstand high voltage (e.g., SiC or GaN transistors), or (2) utilize circuit stacking approaches that divide an applied high voltage among multiple series-connected lower voltage switches. While the lower voltage switches may comprise diodes, MEMS devices, transistors of various types, or similar well-known devices, a quite common type of lower voltage switch is a field effect transistor (FET), particularly a MOSFET.

FIG. 1 is a cross-sectional view of a prior art silicon-on-insulator (SOI) N-type enhancement mode MOSFET 100 (note that the dimensions of various elements are not to scale). The transistor comprises a source S, a self-aligned gate G, and a drain D formed in a silicon (Si) active layer, typically within an isolation region 101 such as a shallow trench isolation (STI) region. The Si active layer is in turn formed on a buried oxide (BOX) layer formed on top of an Si Substrate. A p-well (i.e., a region doped with P-type material, such as boron) is formed in the Si active layer, and the gate G is formed above a region of the p-well, thereby defining a channel 102. The source S and the drain D regions are formed within the p-well adjacent the gate G by implanting or diffusing N+ material (such as phosphorus or arsenic), and thus bracket the channel 102.

In this example, the gate G comprises an insulator (e.g., an oxide layer) 104 and overlaying gate material (e.g., polysilicon or metal) 106. Offset spacers 108 along the sides the gate G may also be formed as part of the fabrication process for making the gate G. More details on the use and fabrication of offset spacers may be found in U.S. patent application Ser. No. 14/921,976, filed Oct. 23, 2015, entitled "Switch Device Performance Through Utilization of Offset Spacers", the contents of which are hereby incorporated by reference.

Electrically conductive contacts 110, 112, 114 are made to the source S, the gate G, and the drain D, respectively. Other common structures (e.g., device interconnects, etc.) are omitted for clarity. The multiple steps needed for making elements and features of the MOSFET structure, such as masking, doping (via implanting, diffusion, etc.), epitaxial growing, cleaving, polishing, etc., are well known in the art.

As is known in the art, P-type enhancement mode MOSFETs have a similar structure, but with different doping characteristics, as do N-type and P-type depletion mode MOSFETS. Complementary metal-oxide-semiconductor (CMOS) devices use pairs of P-type and N-type MOSFETs, which may be either enhancement mode or depletion mode structures. Enhancement mode CMOS devices have very low power consumption and have become the dominant implementation technology for modern electronic systems, particularly battery-powered electronic systems.

The MOSFET 100 can be operated as an electrical switch by applying a gate-source voltage, $V_{GS}$, to the gate G sufficiently positive to turn the transistor ON, thereby creating a low impedance current path between the source S and the drain D through the channel 102. The MOSFET 100 is turned OFF by applying a $V_{GS}$ to the gate G at a voltage less than the threshold voltage, $V_T$, of the device, thereby creating a high impedance path between the source S and the drain D.

As transistor requirements increased and device sizes shrank, additional elements have been added to the basic MOSFET structure to maintain or improve performance. One of the most important parameters that had to be improved as devices shrank (and in particular, when gate lengths shrank) was the maximum voltage handling capability of the transistor device. As used in this disclosure, this metric is the maximum voltage between source and drain that a transistor can withstand while remaining in a non-conducting state (i.e., no current flow between source and drain when the gate voltage is below the transistor's threshold voltage). More specifically, the breakdown voltage, $BV_{DSS}$ (sometimes called $V_{BDSS}$) of a MOSFET is the drain-source voltage at which no more than a specified drain current will flow at a specified temperature and with zero gate-source voltage [noting that breakdown of a MOSFET may be caused by various effects, being primarily avalanche breakdown (i.e., drain-channel driven breakdown), but also including punch-through (i.e., drain-source breakdown), and drain-substrate breakdown in bulk silicon; in addition, FETs inherently include a bipolar junction transistor (BJT) comprising the source, channel and drain, which is also susceptible to breakdown under certain conditions]. Without more, typical commercially available designs for N-type MOSFETs of the type described above that are made with 65-180 nm design rules have a DC breakdown voltage of no more than about 2-3V (noting that the DC breakdown voltage is no more than about 2V when design rules drop below about 130 nm).

Well-known improvements to the maximum voltage handling capability of a MOSFET have included use of lightly doped drain (LDD) regions and high angle, low offset (HALO) implants. An LDD implant mitigates avalanche breakdown while a HALO implant mitigates punch-through. In FIG. 1, LDD regions 120 are lightly-doped with N type material to extend the source S and drain D underneath the gate G. The LDD regions 120 reduce high electric fields caused by the applied drain D voltage, thereby increasing the drain-channel breakdown voltage. HALO implants 122 are pocket regions implanted with increased P type material (which may be P+ type material) that increase a sub-surface electric field to reduce so-called punch-through, or short channel, conduction between the source S and the drain D, also increasing breakdown voltage. Fabricating MOSFETs with LDD regions and/or HALO implants is commonplace, yet often requires specific fabrication masks (for HALO implants) and/or process steps, thus adding to the cost of such devices.

A further improvement in handling high source-drain voltages is the laterally diffused metal oxide semiconductor (LDMOS) transistor, which includes an asymmetric drain connection spaced from the gate G by an LDD region extended well beyond the edge of the gate G, thereby enabling higher voltages to be withstood. However, additional elements such as a gate shield are generally required to ensure that the laterally diffused ("LD") extended drain D and the gate G region align electrostatically. Further, LDMOS transistors typically require special processes that do not integrate well with traditional CMOS circuitry, so most LDMOS transistors are sold as discrete devices in power amplifier markets. Additional information about the structure of LDMOS transistors may be found, for example, in U.S. Pat. No. 7,230,302 B2, issued Jun. 12, 2007, entitled "Laterally Diffused Metal Oxide Semiconductor Device and Method Forming the Same"; U.S. Pat. No. 7,638,380 B2, issued Dec. 29, 2009, entitled "Method for Manufacturing a Laterally Diffused Metal Oxide Semiconductor Device"; and U.S. Pat. No. 7,829,945 B2, issued Nov. 9, 2010, entitled "Lateral Diffusion Field Effect Transistor with Asymmetric Gate Dielectric Profile".

The above improvements have been reasonably effective at enabling scaling down of MOSFETs and thereby enabling modem integrated circuits to follow the well-known "Moore's Law". However, they only increase breakdown voltages by relatively small amounts (from less than a volt up to a few volts). For example, typical commercially available designs for N-type MOSFETs having LDD regions and HALO implants and made with 65-180 nm design rules have a DC breakdown voltage ($BV_{DSS}$) of no more than about 3V (P-type MOSFETs, which typically do not need or use HALO implants, have only a slightly higher $BV_{DSS}$ of about 4V). Accordingly, these design tweaks have not been able to create individual MOSFET devices that can withstand higher supply voltages. More exotic fabrication high voltage technologies, such as SiC or GaN transistors, are expensive and do not integrate well with other technologies, such as CMOS logic. Thus, a disadvantage of prior art high voltage switches is that they require specialized processing or exotic materials which adversely impacts cost, size, and availability.

The other approach to withstanding a high supply voltage—stacking low-voltage switches—has the drawback that large stacks of switches are required to withstand high voltages. For example, 25-35 or more conventional series-connected MOSFETs, even with LDD and HALO features, may be required to withstand a DC supply voltage of 75-100V. In the case of using MOSFETs as switches in such a stack, the areal size of the stack increases with the stack height squared, thereby further increasing the size and cost of the final product.

Neither of the conventional approaches provides a complete solution needed to withstand high voltages. Moreover, neither of the conventional approaches provides a complete solution needed to make high-voltage switches using standard MOSFET (and particularly CMOS) processing that can meet modern size, efficiency, and cost requirements.

Accordingly, there is a need for a switching device that can withstand high voltage and yet be fabricated in a standard low-voltage process, such as CMOS, and more specifically SOI CMOS. Such a switching device should be small in size, efficient, and low cost. The present invention addresses this and other needs.

SUMMARY

The invention encompasses high-voltage switching devices that can be fabricated in a standard low-voltage process. Embodiments of the invention include integrated circuits that combine, in a unitary structure, a FET device and an integrated, co-fabricated modulated resistance region controlled by one or more Voltage-Drop Modulation Gates (VDMGs). The VDMGs are generally biased independently of the gate of the FET device, and in such a way as to protect each VDMG from excessive and potentially destructive voltages (i.e., from excessively high electric fields).

In a first embodiment, an integrated circuit high voltage switching device in accordance with the present invention includes: a transistor structure including a source, a gate, an internal drain, and a channel between the source and internal drain; a modulated resistance region co-fabricated with the transistor structure and electrically connected to the internal drain of the transistor structure; at least one VDMG, fabricated with respect to the modulated resistance region so as to control the resistance of the modulated resistance region; and a drain electrically connected to the modulated resistance region and configured to be coupled to a voltage source. The at least one VDMG controls the resistance of the modulated resistance region by at least partially depleting the modulated resistance region upon application of a bias voltage.

In a second embodiment, an integrated circuit high voltage switching device in accordance with the present invention includes the elements of the first embodiment, and a deep well region proximate to at least a portion of the modulated resistance region, with at least one substrate contact in electrical contact with the deep well region for applying a bias voltage to the deep well region. Applying a bias voltage to the deep well region through the substrate contact further depletes the modulated resistance region so as to control the resistance of the modulated resistance region.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 2A is a cross-sectional view of a first embodiment of a high voltage switching device (HVSD) in accordance with the invention.

FIG. 2B is a cross-sectional view of a second embodiment of a high voltage switching device (HVSD) in accordance with the invention.

FIG. 4 is a process flow diagram showing one method for fabricating an integrated circuit HVSD in accordance with the present invention.

DETAILED DESCRIPTION

The invention encompasses a high-voltage switching device that can be fabricated in a standard low-voltage process. Embodiments of the invention include integrated circuits that combine, in a unitary structure, a FET device and an integrated, co-fabricated modulated resistance region controlled by one or more Voltage-Drop Modulation Gates (VDMGs). The VDMGs are generally biased independently of the gate of the FET device, and in such a way as to protect each VDMG from excessive and potentially destructive voltages (i.e., from excessively high electric fields).

First Embodiment

FIG. 2A is a cross-sectional view of a first embodiment of a high voltage switching device (HVSD) 200 in accordance with the invention (note that the dimensions of various elements are not to scale). The illustrated embodiment may be fabricated using the same technology and materials as for enhancement mode N-type MOSFETs. Other embodiments may be fabricated using the same technology and materials as for enhancement mode P-type MOSFETs, and yet other embodiment may be fabricated as depletion mode N-type MOSFETs or P-type MOSFETs. Further, embodiments may be fabricated using the same technology and materials as for CMOS MOSFETs. In some embodiments, no additional masks are required.

Figure 1:
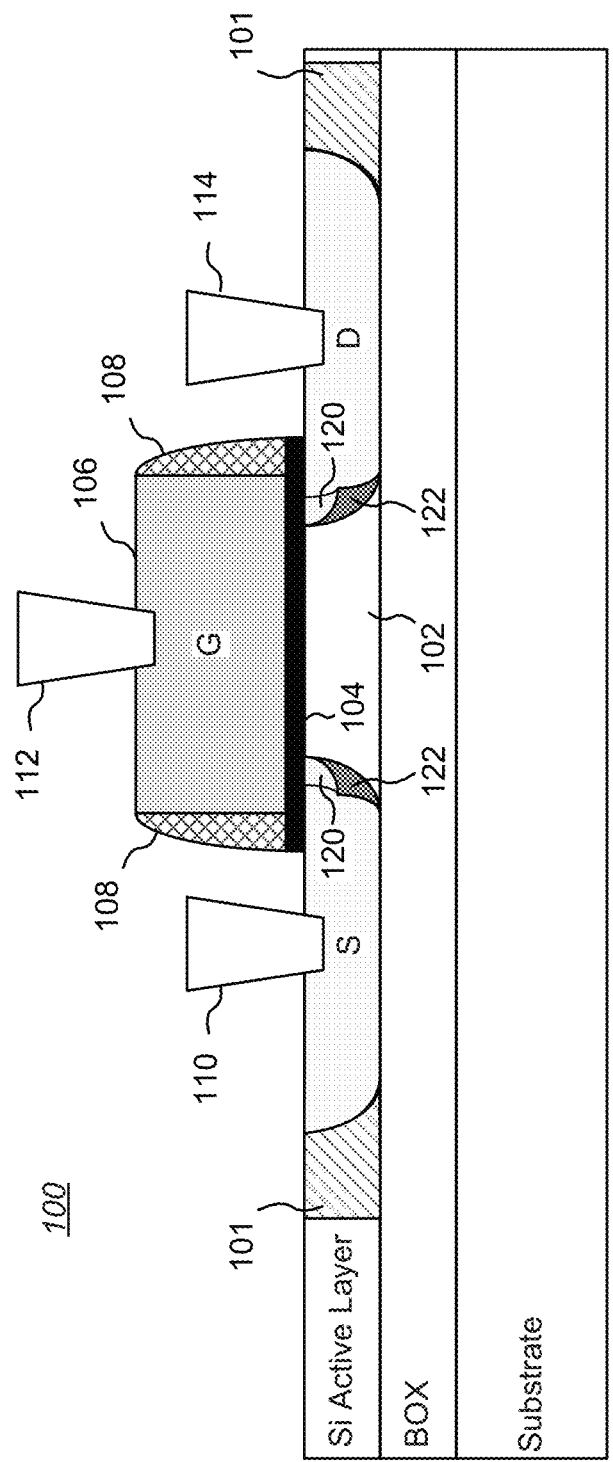
FIG. 1 is a cross-sectional view of a prior art silicon-on-insulator (SOI) N-type enhancement mode MOSFET.

Starting from the left side of the illustrated structure, the HVSD 200 device includes a transistor structure 202 (indicated by a dashed circle) that essentially comprises an N-type MOSFET, very similar to the structure shown in FIG. 1. More specifically, a p-region or layer is formed within an isolation region 101 of an Si active layer above a BOX layer on a Substrate, and a gate G is formed above a portion of the p-region, thereby defining a channel 102. The Substrate may be, for example, a high resistivity substrate, but low resistivity substrates commonly used for power FETs may also be used. Examples of high resistivity substrates includes silicon-on-insulator (SOI) and silicon-on-sapphire (SOS). When SOS substrates are used, a BOX layer may or may not be present; for avoidance of doubt, embodiments of the invention do not require the presence of a BOX layer. A similar process may be used for bulk silicon CMOS FETs, but, as one of ordinary skill in the art would appreciated, additional doped wells may be required that insure a high breakdown voltage to the substrate.

A source S is formed as an N+ doped region within the p-region adjacent the gate G, as is an N+ doped region that may be considered to be an "internal drain" 204. Electrically conductive contacts 110, 112 are made to the source S and the gate G, respectively. However, unlike a conventional MOSFET, the internal drain 204 would normally be formed without such an electrically conductive contact (nevertheless, a conductive contact optionally may be made to the internal drain 204 of the transistor region 202, for example, to test or characterize the transistor structure 202 independently of the remainder of the HVSD 200).

As with a conventional MOSFET, the transistor structure 202 can be operated as an electrical switch by applying a gate-source voltage, $V_{GS}$, to the gate G sufficiently positive with respect to the threshold voltage, Vt, of the device to turn the transistor ON, thereby creating a low impedance current path between the source S and the internal drain 204 through the channel 102. Similarly, the transistor structure 202 is turned OFF by applying a $V_{GS}$ to the gate G at a voltage less than the threshold voltage, $V_T$, of the device, thereby creating a high impedance path between the source S and the internal drain 204.

Adjacent to and in contact with the internal drain 204, a region is doped with N-type material to form an n-well that defines a modulated resistance region 206. The modulated resistance region 206 can be doped at different levels to allow different types of electric field control, as further described below. Formed in contact with or near the modulated resistance region 206 are one or more Voltage-Drop Modulation Gates (VDMGs) 208 that control the resistance of the modulated resistance region 206. The VDMGs 208 may be identical in structure and materials as the gate G of the transistor structure 202, and formed at the same time. However, the VDMGs 208 are generally biased independently of the gate G of the transistor structure 202, and in such a way as to protect each VDMG 208 from excessively high electric fields, as described in greater detail below.

The VDMGs 208 are shown in FIG. 2A as non-overlapping and without doped N+ regions or silicide layers between them. This is a design choice that can trade ON resistance for maximum withstand voltage. For example, placing the VDMGs 208 close to each other, such that the depletion zone under each VDMG 208 overlaps with the depletion zones of one or more adjacent VDMGs 208, provides a low ON state resistance and at the same time provides a high $BV_{DSS}$ in the OFF state (but not a maximal $BV_{DSS}$—overlapping the depletion zones will reduce breakdown voltage as compared to non-overlapping depletion zones). Other doping profiles and lengths for the regions between VDMGs 208 and/or use of a silicide layer applied to the surface of the HVSD between VDMGs 208 may be selected to achieve other design goals. Also, in general, it may be desirable to make the spacing between VDMGs 208 as small as foundry design rules permit for a particular implementation technology.

Adjacent the final modulated resistance region 206 is an N+ doped drain D, which would generally be formed at the same time as the source S and the internal drain 204. An electrically conductive contact 114 is made to the drain D, which would generally be formed at the same time as the electrically conductive contacts 110, 112 for the source S and the gate G, respectively. The drain D is spaced apart from the internal drain 204 by the modulated resistance region 206 and one or more VDMGs 208.

As so configured, the drain D of the HVSD 200 may be coupled, directly or indirectly, to a high voltage DC supply (e.g., 50-100 VDC), while the source S may be coupled to a potential (such as ground) or other circuitry (including the drain D of another HVSD 200; i.e., HVSD's may be stacked, for example as an output stage of a high-voltage DC/DC converter). Examples of such DC/DC converters are set forth in co-pending U.S. patent application Ser. No. 15/266,784, referenced above, and in U.S. Pat. No. 7,719,343, issued May 18, 2010, entitled "Low Noise Charge Pump Method and Apparatus", U.S. Pat. No. 8,686,787, issued Apr. 1, 2014, entitled "High Voltage Ring Pump with Inverter Stages and Voltage Boosting Stages", U.S. Pat. No. 9,264,053, issued Feb. 16, 2016, entitled "Variable Frequency Charge Pump", and U.S. Pat. No. 9,413,362, issued Aug. 9, 2016, entitled "Differential Charge Pump", the contents of which are hereby incorporated by reference.

The modulated resistance region 206 and VDMGs 208 form an N-type depletion structure that is normally ON (i.e., conductive) when the bias voltage applied to the VDMGs 208 is more positive than the threshold voltage for the modulated resistance region 206. Since the modulated resistance region 206 is normally conductive, when the transistor structure 202 is biased ON (i.e., switched to a conductive state), current will flow from the source S to the internal drain 204 and then pass through the modulated resistance region 206 into the drain D, which is in contact with the high voltage. In this way, the illustrated embodiment provides the ON state needed for a high voltage switching device. Further, in the ON state, the bias voltage for the VDMGs 208 may be made even more positive to further reduce the resistance of the n-well modulated resistance region 206, thereby reducing the ON resistance of the HVSD 200.

To switch the HVSD 200 to the OFF state, the gate G of the transistor structure 202 is biased OFF by applying a $V_{GS}$ voltage less than the threshold voltage, $V_T$, of the transistor structure 202, thereby creating a high impedance path between the source S and the internal drain 204 within the channel 102. By itself, the channel 102 is only able to withstand about 3-5V before breakdown or punch-through occurs. However, concurrently, the VDMGs 208 for the modulated resistance region 206 between the internal drain 204 and the drain D are also biased to an OFF state, thereby at least partially depleting the modulated resistance region 206 and thus increasing the resistance of the n-well modulated resistance region 206 to withstand the high voltage applied to the drain D. Further, the VDMGs 208 may be biased sufficiently negative with respect to the threshold voltage for the modulated resistance region 206 to fully deplete the modulated resistance region 206, such that the depletion region under each VDMG 208 reaches the BOX layer and thereby cuts off (pinches off) all current through the modulated resistance region 206, thus further enhancing voltage drop across the modulated resistance region 206.

The n-well for the modulated resistance region 206 may be made in a conventional manner, with a doping of N-type material at least 2 to 3 orders of magnitude less than the doping of N-type material for the source S and drain D implants, and up to 5 orders of magnitude less than the doping of N-type material for the source S and drain D implants. For P-type MOSFETS HVSDs, the polarities of the dopants and types for the various regions and wells would be reversed. Doping may be done by any conventional process, such as diffusion and/or ion implantation, to intentionally introduce impurities into a semiconductor for the purpose of modulating the electrical properties of the semiconductor.

It should be appreciated that the OFF state and/or the ON state resistivity of the modulated resistance region 206 is affected by the doping level applied to that region; accordingly, the conductivity of the modulated resistance region 206 may be partially or fully depleted or partially or fully enhanced in the absence of biasing the VDMGs 208. For example, the modulated resistance region 206 may be doped at a level that permits only partial depletion by the VDMGs 208 rather than full depletion; however, differential doping may require an extra mask. As another example, if the modulated resistance region 206 is partially or fully enhanced, a sufficiently large opposite back-side voltage may be applied (e.g., via the "deep well" region described below) to invert the modulated resistance region 206, thereby reducing the ON resistance of that region.

While the transistor structure 202 is essentially a conventional MOSFET, it should be appreciated that the transistor structure 202 may be any of a wide variety of FET structures, so long as a modulated resistance region controlled by one or more VDMGs 208 can be integrated, and co-fabricated with such a FET structure.

Second Embodiment

FIG. 2B is a cross-sectional view of a second embodiment of a high voltage switching device (HVSD) 250 in accordance with the invention (again, the dimensions of various elements are not to scale). Added to the structure shown in the embodiment of FIG. 2A is a "deep well" region 220 of implanted N-type material in the Substrate below the BOX layer. The deep well region 220 preferably extends proximate to (below, in this case) some or all of the modulated resistance region 206, and may extend under some or all of the transistor structure 202 (as indicated by the dotted-outline extension 220'). Again, for P-type MOSFETS HVSDs, the polarities of the dopants for the various doped regions would be reversed.

At least one conductive substrate contact (S-contact) 222 penetrates through a corresponding isolation region 224 of the Si active layer to the deep well region 220, 220'; the isolation region 224 may be an extension of the drain-side isolation region 101 of FIG. 2A. The material used for the S-contact 222 can be any low resistivity conductive material, such as polysilicon and various metals (e.g., tungsten, copper, etc.). The isolation region 224 can be a shallow trench isolation (STI) region, particularly in the case of an SOI device. By virtue of penetrating through the isolation region 224 within the Si active layer, the S-contact 222 remains isolated from direct contact with other active regions or elements on or in the Si active layer. Further details about S-contacts may be found in U.S. patent application Ser. No. 14/964,412, filed Dec. 9, 2015, entitled "S-Contact for SOT", the contents of which are hereby incorporated by reference.

A bias voltage may be applied through the S-contact 224 to the deep well region 220, 220', which provides the ability to impose an electrical field near the modulated resistance region 206 that can influence the conductivity and/or voltage blocking characteristics of the modulated resistance region 206 (i.e., a form of "back-gate modulation"). Alternatively, a bias voltage can be applied through a metal field plate, such as an aluminum layer, formed on the back side of the BOX layer using a single layer transfer process. Back-gate modulation by means of the deep well region 220, 220' can thus provide additional control over the conductivity of the n-well modulated resistance region 206, and help force full depletion of the modulated resistance region 206 to maximize the voltage handling capability of the VDMGs 208.

Further, the deep well region 220, 220' also can be biased to enhance conductivity in the modulated resistance region 206 so as to reduce the ON resistance between the source S and drain D, $R_{DSon}$. For example, in one sample IC fabricated with a deep well region 220, $R_{DSon}$ was reduced by about 30% by applying a positive bias voltage to the deep well region 220.

Biasing of Voltage-Drop Modulation Gates

Each VDMG 208, in conjunction with the modulated resistance region 206, provides some resistance to the voltage imposed at the drain D. When biased in the OFF state, the VDMG 208 closest to the drain D will drop the voltage applied to the next VDMG 208 along the modulated resistance region 206 by a particular amount, determined by the materials and geometry of the VDMG 208 and the bias voltage applied to the VDMG 208. That next VDMG 208, and each subsequent VDMG 208, will similarly drop the voltage to the next VDMG 208 in line until the internal drain 204 is reached. The number of VDMGs 208 should be set such that the voltage presented at the internal drain 204 is less than the breakdown voltage of the transistor structure 202. For example, if the voltage applied at the drain D is 100 VDC, and the breakdown voltage of the transistor structure 202 is 3V, then the combined voltage drop provided by the VDMGs 208 (in conjunction with the modulated resistance region 206) from the drain D to the internal drain 204 should be at least 97V.

Similar to the transistor structure 202, each VDMG 208 has a breakdown voltage $BV_{DSS}$ beyond which the VDMG 208 will fail. However, the $BV_{DSS}$ of each VDMG 208 is designed to be greater than the $BV_{DSS}$ of the transistor structure 202. In example integrated circuits embodying an HVSD, $BV_{DSS}$ per VDMG 208 has been about 4V for NMOSFET designs, and about 4.5V for PMOS FET designs. Accordingly, an example N-type HVSD with 3 VDMGs 208 has been shown to withstand about 15V (taking into account a 3V $BV_{DSS}$ for an NMOSFET transistor structure 202), and an example P-type HVSD with 3 VDMGs 208 has been shown withstand about 17.5V (taking into account a 4V $BV_{DSS}$ for a PMOSFET transistor structure 202).

Using the 100V voltage drop example from above, if only a single VDMG 208 is used, then that VDMG 208 would have to drop the entire 97V required to prevent breakdown of the transistor structure 202. If $BV_{DSS}$ for that VDMG 208 is only about 4V, then the VDMG 208 would breakdown. Accordingly, the number of VDMGs 208 used to provide the necessary voltage drop from the drain D to the internal drain 204 (i.e., so that the voltage presented at the internal drain 204 is less than the breakdown voltage of the transistor structure 202) should be sufficient such that the voltage applied to each VDMG 208 is less than its corresponding $BV_{DSS}$. For example, if $BV_{DSS}$ is 4V for each VDMG 208, and the voltage drop from the drain D to the internal drain 204 should be at least 97V (the main transistor structure 202 being able to withstand the remaining 3V), then 25 VDMGs 208 should be sufficient to safely provide the required total voltage drop without exceeding $BV_{DSS}$ for any VDMG 208.

Taking into account these constraints, it should be clear that the bias voltages applied to the VDMGs 208 to achieve an OFF state would not necessarily be the same. For example, if the VDMG 208 closest to the drain D is biased such that it fully blocks current flow from the source S to the drain D, then that VDMG 208 would have to withstand the total voltage applied at the drain D (e.g., 100 VDC), which may well exceed $BV_{DSS}$ for that VDMG 208. Accordingly, a better approach is to bias that first VDMG 208 to drop only a fraction of the voltage applied at the drain D (e.g., 4V) by only partially depleting the modulated resistance region 206 influenced by that VDMG 208. The applied input voltage to the next VDMG 208 along the modulated resistance region 206 would then be 100V–4V, or 96V. The next VDMG 208 may then be biased to also drop only a fraction of the voltage applied at the drain D (e.g., 4V or some other value), which may require a different bias voltage than the first VDMG 208, since the applied input voltage to that next VDMG 208 is less. Additional VDMGs 208 in line to the internal drain 204 would similarly be biased in a step-wise or staggered fashion to achieve the total end-to-end voltage drop required to protect the transistor structure 202 without imposing an input voltage on any one VDMG 208 that exceeds $BV_{DSS}$ for that gate. One way of achieving such a step-wise biasing scheme is by using a resistive ladder coupled to the VDMG gates.

For example, for one exemplary embodiment of an N-type HVSD 200 having 5 VDMGs 208 and a voltage applied to the drain of about 22 VDC, the bias voltages for the VDMGs 208 might be (from the VDMG 208 closest to the drain D to the VDMG 208 closest to the internal drain 204) 18V, 14V, 10V, 6V, and 2V, resulting in a voltage at the internal drain 204 of about 2V, which is less than the $BV_{DSS}$ of 3V for the transistor structure 202 in this example.

The specific bias voltage level for each VDMG 208 will depend on the materials and geometry of the VDMG 208, the number of VDMGs 208, and the voltage applied to the drain D, and accordingly is device and circuit dependent. Further, dynamic control of the modulated resistance region 206 as a function of the bias voltage applied to each VDMG 208 may be applied to allow electrical fine tuning to accommodate or counteract unit-to-unit performance variations due to individual doping variations that may occur in fabricating HVSD devices. Moreover, while the examples above have used equal voltage drops across a series of VDMGs 208, unequal voltage drops may be used in some embodiments (noting also that process variations may cause voltage drop variations among VDMGs 208 even if they are designed to provide equal voltage drops).

In general, the VDMGs 208 may be sized and fabricated to each withstand higher voltage compared to the transistor structure 202. Further, the number of VDMGs 208 can be chosen to withstand a desired high voltage across an HVSD 200. This creates a substantial advantage over prior art devices, since the maximum voltage handling capability is a design parameter (i.e., number of VDMGs 208) rather than a process parameter (which is typically expensive and difficult to adjust).

Example Device Layout

FIGS. 3A-3F are top plan views of one example fabrication sequence for the HVSD 200 of FIG. 2A (for added clarity, some reference numbers are not repeated in successive figures). As should be appreciated, the sequence has been simplified, and many different techniques and sequences may be used to fabricate a similar device.

Figure 3A:
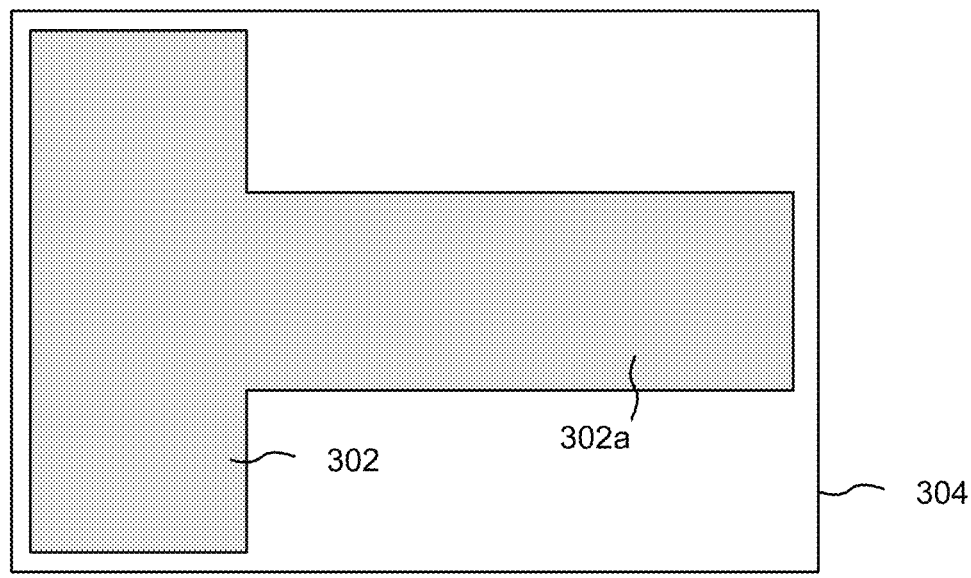
FIGS. 3A-3F are top plan views of one example fabrication sequence for the HVSD of FIG. 2A.

In FIG. 3A, a T-shaped island 302 of silicon Si and a surrounding isolation region 304 are formed in conventional fashion on top of a BOX layer (not separately shown) on an SOI Substrate (not separately shown). The isolation region 304 may be, for example, $SiO_2$. An extension 302a of the Si island 302 will become the modulated resistance region 206 of FIG. 2A after further processing. A deep well (not shown in this plan view, but shown in FIG. 2B in cross-section) may be formed in the Substrate directly or through the BOX layer using known methods.

Figure 3B:
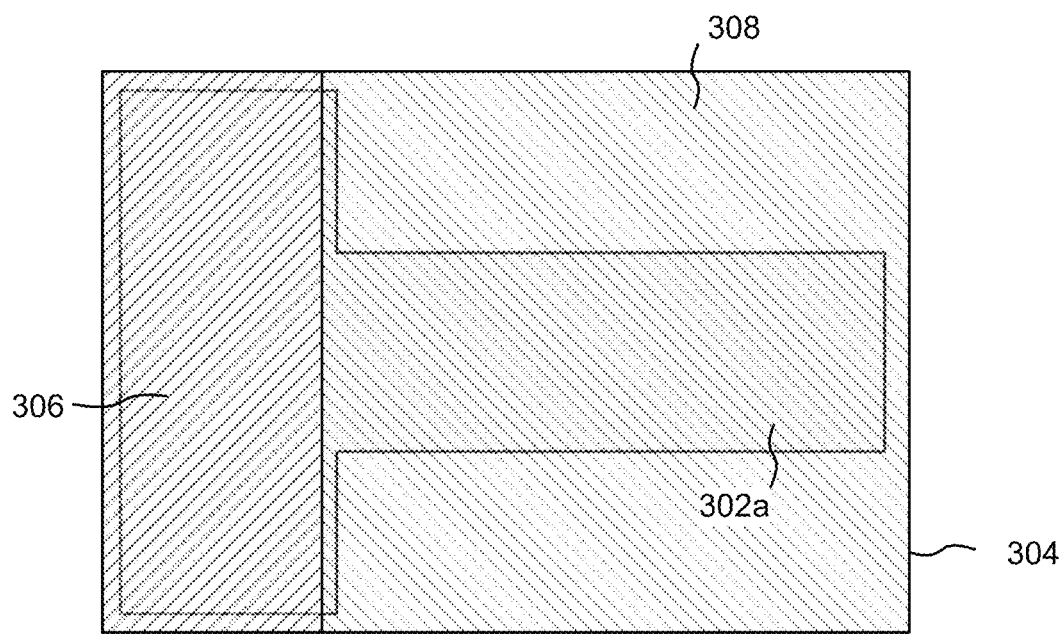

In FIG. 3B, a first region 306 of the Si island 302 is masked off and implanted with P-type material to form a p-region, part of which will become the channel 102 of the transistor structure 202 shown in FIG. 2A. Similarly, a second region 308 of the Si island 302 is masked off and implanted with N-type material to form an n-well in the extension 302a of the Si island 302 (i.e., the modulated resistance region 206 of FIG. 2A). For a CMOS integrated circuit embodiment of an HVSD, the p-region implant may be done during the formation of nFET transistor structures 202, and the n-well implant may be done during the formation of pFET transistor structures 202, all as part of a conventional CMOS process flow. Accordingly, since the CMOS process flow always includes both nFET and pFET structures, no additional masks are needed. Thus, two HVSD's may be formed and connected on an IC to create a CMOS structure, such that the source, internal drain, and drain of at least one HVSD comprise semiconductor regions of a first polarity, and the channel comprises a semiconductor region of a second polarity, and such that the source, internal drain, and drain of at least HVSD comprise semiconductor regions of the second polarity, and the channel comprises a semiconductor region of the first polarity.

Figure 3C:
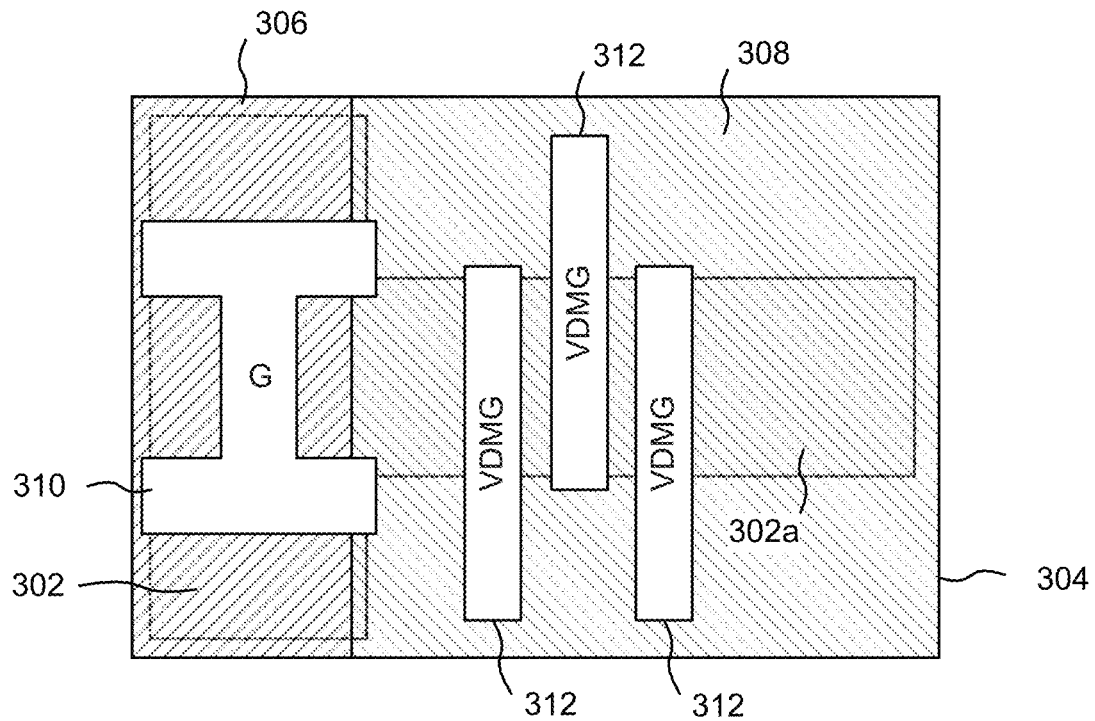

In FIG. 3C, a gate structure 310 is formed over the Si island 302 to define the gate G and the channel 102 for the transistor structure 202 of FIG. 2A. Concurrently, VDMGs 312 (three in this example) are formed over the n-well in the extension 302a of the Si island 302. Each gate structure 310, 312 comprises an insulator (e.g., an oxide layer) and overlaying gate material (e.g., polysilicon, pre-doped polysilicon, metal, etc.).

Figure 3D:
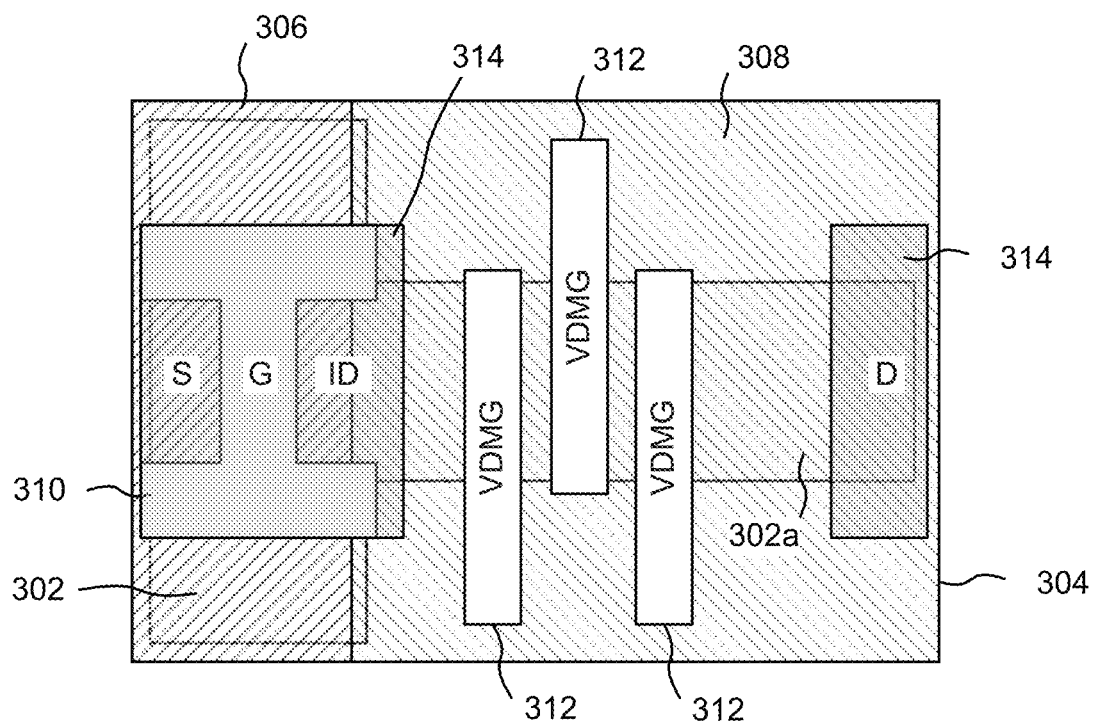

In FIG. 3D, two masked implant areas 314 are used to implant N+ dopant to form the source S, the internal drain ID, and the drain D.

Figure 3E:
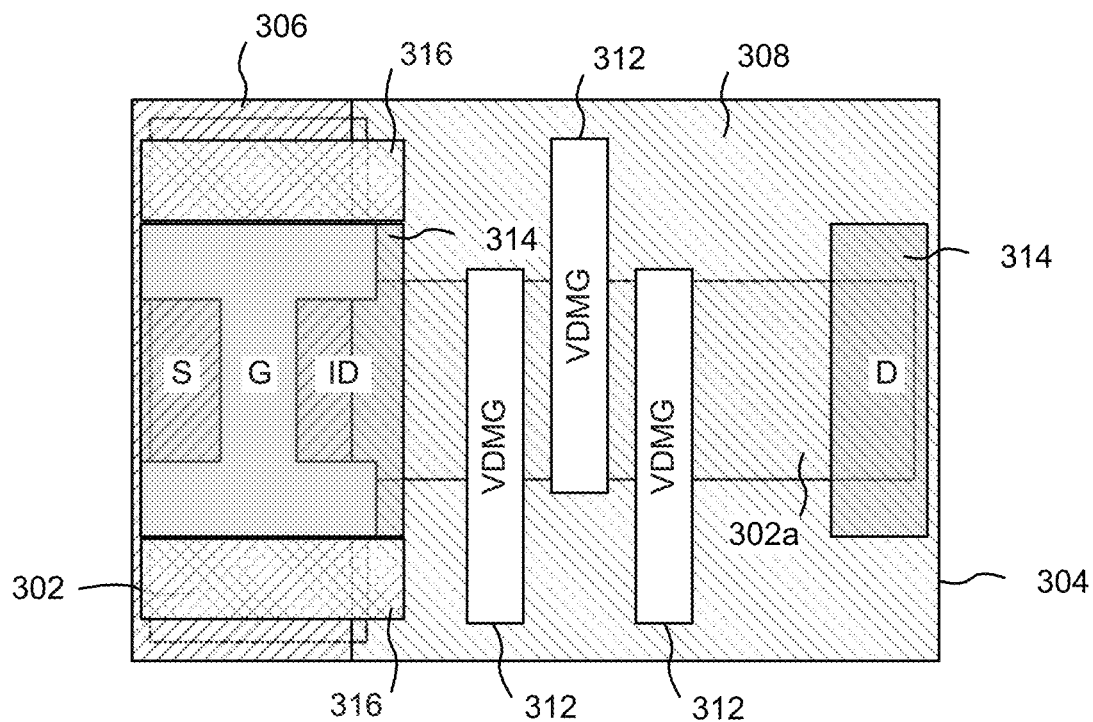

In FIG. 3E, two masked implant areas 316 are used to implant P+ dopant to facilitate formation of a gate or source body tie connection (e.g., a direct connection or a diode, not shown), for example, by using a conductive interconnect (e.g., metal) in another layer of the structure (not shown). Body ties are described, for example, in U.S. Pat. No. 7,890,891, issued Feb. 15, 2011, entitled "Method and Apparatus Improving Gate Oxide Reliability by Controlling Accumulated Charge" and in U.S. Pat. No. 7,910,993, issued on Mar. 22, 2011, entitled "Method and Apparatus for Use in Improving Linearity of MOSFETS Using an Accumulated Charge Sink", both of which are assigned to the assignee of the present invention and hereby incorporated by reference. Inclusion of body tie implant areas 316 is an option that may be chosen for various beneficial reasons, especially in analog and mixed signal applications. Advantages of body ties may include improved output resistance, higher gain, and improved linearity, among others. Body ties can also increase the $BV_{DSS}$ of the transistor structure 202 by a few tenths of a volt.

Figure 3F:
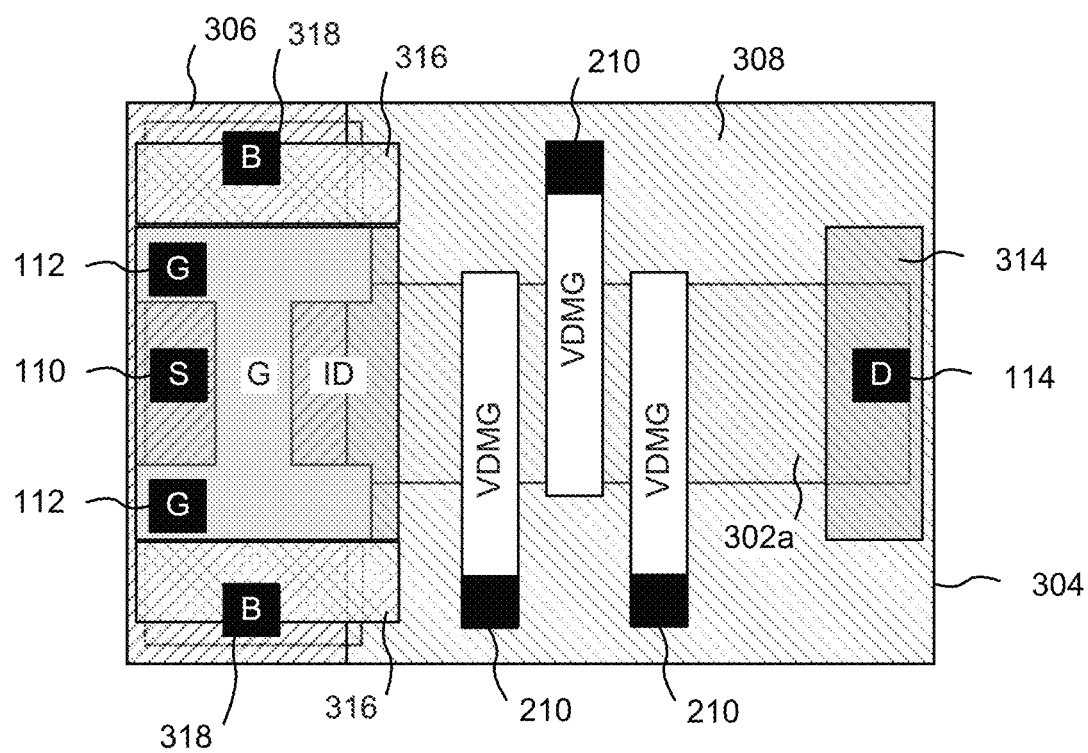

In FIG. 3F, electrically conductive contacts 110, 112, 114, 210 (using the reference numbers from FIG. 2A) are respectively made to the source S, the gate G (two contacts are shown), the drain D, and to each of the VDMGs 312. In addition, electrically conductive contacts 318 are made to the body of the device. A contact is not necessary for the internal drain, as noted above.

As one of ordinary skill in the art will appreciate, other structures (e.g., device interconnects, deep well region 220, etc.) are omitted for clarity, and other or additional steps may be involved in the formation of the structures depicted in FIGS. 2A-2B and FIGS. 3A-3F. Further, some of the steps described above may be performed in an order different from that described. A person of ordinary skill in the art of FET fabrication will understand that many possible layout options exist beyond those illustrated in FIGS. 3A-3F without departing from the teachings of the present invention.

Note that for bulk CMOS (rather than SOI CMOS), the process illustrated in FIGS. 3A-3F may need to be adapted for a multiple-well process designed for high voltage breakdown to the Substrate (e.g., 100V). Further, while the illustrated example utilizes a CMOS MOSFET process with an SOI Substrate, it may be adapted for GaAs MESFETs and other technologies.

Advantages & Variant Embodiments

The HVSD 200, 250 structures shown in FIG. 2A and FIG. 2B are capable of increasing breakdown voltages substantially for a switching device. For example, a conventional MOSFET may have a breakdown voltage of a few volts, while an HVSD with a modulated resistance region 206 and one or more VDMGs 208 may have a breakdown voltage of tens of volts or more. In general, the invention encompasses embodiments that have a $BV_{DSS}$ per VDMG 208 that can exceed at least about 4V for NMOSFET designs, and at least about 5V for PMOSFET designs. Accordingly, HVSDs may increase the device $BV_{DSS}$ by at least an amount equal to the $BV_{DSS}$ of a conventional MOSFET.

With multiple VDMGs 208, an HVSD may have a breakdown voltage of 50-100V or more. Further, a single device architecture covers a wide range of voltage domains (e.g. 5-15V, 25-35V, 80-100V, etc.), with fine granularity, simply by adjusting the number of VDMGs 208 in an HVSD.

All of the HVSD structures depicted in FIGS. 2A-2B and FIGS. 3A-2F may be fabricated using standard, commercially available SOI (including silicon-on-sapphire) CMOS processes without the need for additional masks in many embodiments. Therefore, HVSD devices can be co-designed and co-fabricated with standard CMOS logic and circuitry. In addition to providing additional functionality, this aspect also provides the well-known low cost and high reliability advantages of CMOS technology.

Most generally, an HVSD includes integrated circuits that combine, in a unitary structure, a FET transistor structure and an integrated, co-fabricated modulated resistance region controlled by one or more VDMGs. Regardless of fabrication materials or technique, the modulated resistance region should (1) readily conduct current between the drain and an internal drain of the FET transistor structure when the FET transistor structure is switched ON so as to conduct current between the source S and drain D, and (2) drop the voltage between the drain D and the internal drain of the FET transistor structure to less than the breakdown voltage of the FET transistor structure when the FET transistor structure is switched OFF.

Embodiments may beneficially include LDD regions and HALO implants to change or enhance the operational parameters of an HVSD. For example, LDDs may improve gate oxide reliability, and a light version of an LDD implant may be beneficial in some embodiments to reduce the ON resistance, $R_{ON}$, of an HVSD.

In some embodiments, the internal drain 204 may have a different level of doping than the source S, or be doped with a different N-type material. In some embodiments, the internal drain 204 may be an extension of the n-well that defines the modulated resistance region 206, rather than a separate N+ doped region. In some embodiments, the Substrate may be a highly doped P+ substrate. In PMOSFET variants of the HVSD, the dopant types are reversed compared to NMOSFET variants. Both NMOSFET and PMOSFET versions of the HVSD can be combined to form CMOS devices.

Compared to prior art stacking of multiple distinct FETs to withstand high voltages, HVSDs (i.e., devices with a modulated resistance region 206 controlled by VDMGs 208 and co-fabricated with a transistor structure 202) results in a smaller area on an IC. Further, since the VDMGs 208 may be fabricated on an n-well (rather than adjacent to N+ doped source and drain regions, as is the case for the gates of stacked multiple distinct FETs), the allowed drain-gate voltage, $V_{DG}$, for each VDMG 208 is much larger than for the transistor structure 202. Consequently, the $BV_{DSS}$ per VDMG 208 can be designed to be much larger (e.g., up to 1.5 times or more) than the $BV_{DSS}$ of the transistor structure 202, and the $BV_{DSS}$ for an HVSD can be designed to be more than twice the $BV_{DSS}$ of a conventional single-gate MOSFET.

At the circuit level, a lower total gate capacitance, $C_{GG}$ for an HVSD may be achieved if the VDMGs 208 are biased ON before the transistor structure 202 is biased ON, thus leading to faster switching, using a suitable timing and bias circuit (not shown). Note that if the VDMGs 208 are biased ON before the transistor structure 202 is biased ON, the potential across the transistor structure 202 will not float up to the voltage needed for breakdown if the number of VDMGs 208 is reasonably high (the number depends on the length of the modulated resistance region 206), since there will be a potential drop from the drain D to the internal drain 204.

Embodiments of the inventive HVSD architecture are less susceptible to damage due to electrostatic discharge (ESD) events than conventional MOSFETS. The single relatively large BJT inherent in an HVSD device has a very inefficient base (i.e., the base is wide and resistive) which does not breakdown easily, giving enhanced ESD immunity to the device, a useful characteristic for power switching applications.

HVSDs perform better than stacked FETs since there are no narrow-base (and thus high gain) BJTs in series. Stacked FETs inherently present a series of small BJTs, one or more of which can breakdown during turn ON and damage the associated FETs.

As noted above, breakdown of a MOSFET may be caused by various effects, including avalanche breakdown, punch-through, and, in bulk silicon, drain-substrate breakdown. While the primary breakdown mechanism is avalanche breakdown, all of these breakdown mechanisms are mitigated by the invention by reducing the amount of voltage on the drain of a FET device.

Methods

Another aspect of the invention includes methods for fabricating an HVSD. For example, FIG. 4 is a process flow diagram 400 showing one method for fabricating an integrated circuit HVSD in accordance with the present invention, including fabricating, in a unitary structure, (1) a FET transistor structure having a source, a gate, and an internal drain, (2) an integrated, co-fabricated modulated resistance region coupled to the internal drain and controlled by one or more voltage-drop modulation gates, and (3) a drain (STEP 402).

Figure 5:
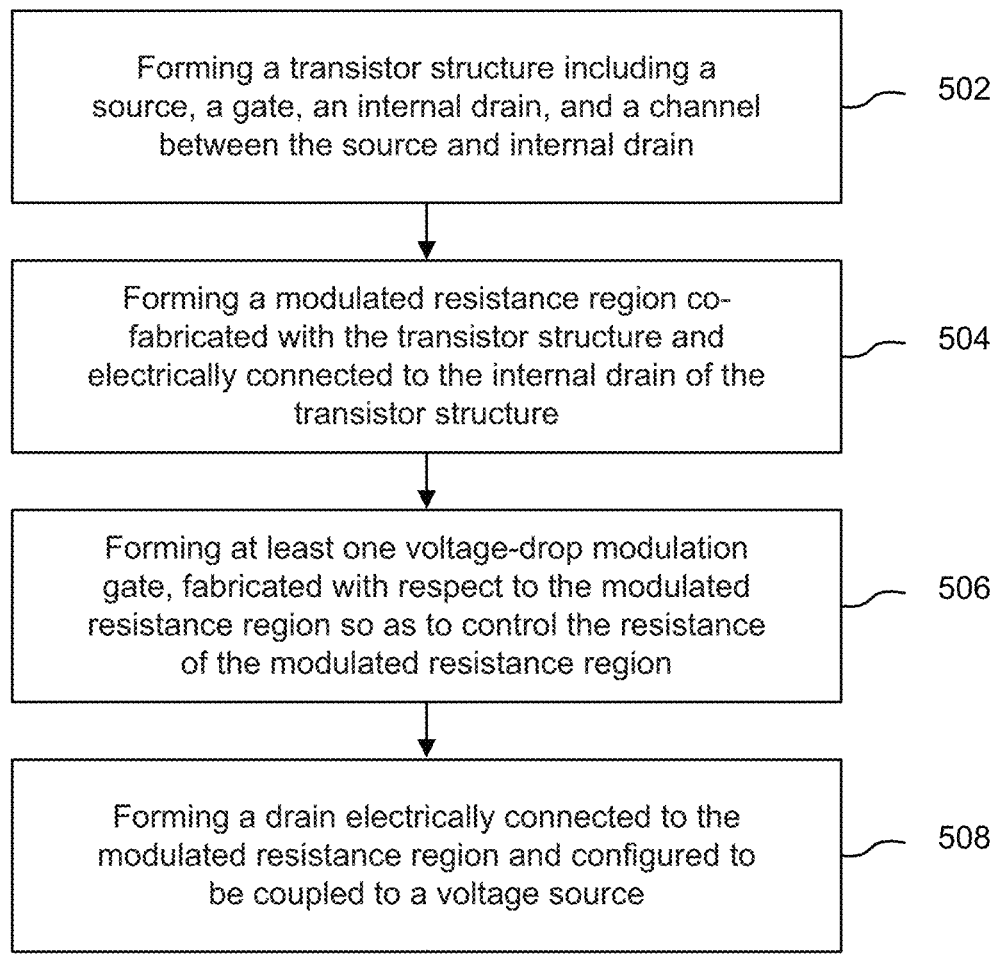
FIG. 5 is a process flow diagram showing another method for fabricating an integrated circuit HVSD in accordance with the present invention Like reference numbers and designations in the various drawings indicate like elements.

As another example, FIG. 5 is a process flow diagram 500 showing another method for fabricating an integrated circuit HVSD in accordance with the present invention, including: forming a transistor structure including a source, a gate, an internal drain, and a channel between the source and internal drain (STEP 502); forming a modulated resistance region co-fabricated with the transistor structure and electrically connected to the internal drain of the transistor structure (STEP 504); forming at least one voltage-drop modulation gate, fabricated with respect to the modulated resistance region so as to control the resistance of the modulated resistance region (STEP 506); and forming a drain electrically connected to the modulated resistance region and configured to be coupled to a voltage source (STEP 508).

Other aspect of these methods may include one or more of the following: the modulated resistance region (1) readily conducts current between the drain and the internal drain when the FET transistor structure is switched ON so as to conduct current between the source and drain, and (2) drops an applied voltage on the drain to less than the breakdown voltage $BV_{DSS}$ of the FET transistor structure when the FET transistor structure is switched OFF; further including forming a plurality of voltage-drop modulation gates series-connected between the internal drain and the drain; wherein the source, internal drain, and drain of at least one integrated circuit high voltage switching device comprise semiconductor regions of a first polarity, and the channel comprises a semiconductor region of a second polarity; wherein the first polarity is N-type material and the second polarity is P-type material; wherein the first polarity is P-type material and the second polarity is N-type material; wherein the source, internal drain, and drain of at least one integrated circuit high voltage switching device comprise semiconductor regions of a first polarity, and the channel comprises a semiconductor region of a second polarity, and wherein the source, internal drain, and drain of at least another integrated circuit high voltage switching device comprise semiconductor regions of the second polarity, and the channel comprises a semiconductor region of the first polarity; wherein the modulated resistance region comprises a semiconductor region of the first polarity, doped up to about 5 orders of magnitude less than the source and drain; wherein the at least one voltage-drop modulation gate controls the resistance of the modulated resistance region by at least partially depleting at least a portion of the modulated resistance region upon application of a bias voltage to the at least one voltage-drop modulation gate; wherein the at least one voltage-drop modulation gate controls the resistance of the modulated resistance region by fully depleting at least a portion of the modulated resistance region upon application of a bias voltage to the at least one voltage-drop modulation gate; further including fabricating the integrated circuit high voltage switching device on a silicon-on-sapphire substrate; further including fabricating the integrated circuit high voltage switching device on a silicon-on-insulator substrate; wherein the silicon-on-insulator substrate further includes a deep well region proximate to at least a portion of the modulated resistance region, and further including at least one substrate contact in electrical contact with the deep well region for applying a bias voltage to the deep well region; wherein the deep well region is the same polarity as the modulated resistance region; wherein the at least one voltage-drop modulation gate controls the resistance of the modulated resistance region by at least partially depleting at least a portion of the modulated resistance region upon application of a first bias voltage to the at least one voltage-drop modulation gate, and wherein the deep well region further depletes at least a portion of the modulated resistance region upon application of a second bias voltage to the at least one substrate contact; wherein the breakdown voltage per voltage-drop modulation gate is at least about 4V; wherein the breakdown voltage per voltage-drop modulation gate is greater than the breakdown voltage of the transistor structure; further including fabricating the integrated circuit high voltage switching device using a CMOS process; wherein surface regions of the modulated resistance region adjacent the at least one voltage-drop modulation gate are doped with a material having a first polarity and at a higher doping concentration than the modulated resistance region under the at least one voltage-drop modulation gate; and further including forming a silicide layer on surface regions of the modulated resistance region adjacent the least one voltage-drop modulation gate.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures). Integrated circuit embodiments may be fabricated using any suitable substrates and processes, including but not limited to standard bulk silicon (if suitable insulating wells are used to isolate the active devices from the substrate, and the well to substrate breakdown voltage exceeds the applied voltage), silicon-on-insulator (SOI), and silicon-on-sapphire (SOS). Unless otherwise noted above, the invention may be implemented in other transistor technologies such as GaAs HBT, GaN HEMT, GaAs pHEMT, and MESFET technologies. However, the inventive concepts described above are particularly useful with an SOI-based fabrication process (including SOS), and with fabrication processes having similar characteristics.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to withstand greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. At least one integrated circuit high voltage switching device, including:
    (a) a transistor structure including a source formed within an integrated circuit active layer region and having a first doping level, an internal drain formed within the integrated circuit active layer region and having a second doping level, a channel formed within the integrated circuit active layer region between the source and the internal drain and having a third doping level, and a gate formed over only the channel and spanning between the source and the internal drain;
    (b) a modulated resistance region co-fabricated with the transistor structure and comprising a second integrated circuit active layer region having a fourth doping level different from the third doing level, the modulated resistance region being electrically connected to the internal drain of the transistor structure; and spaced at a first edge from the channel by the internal drain;
    (c) a drain formed within the integrated circuit active layer region and having a fifth doping level, the drain being electrically connected to a second edge of the modulated resistance region and configured to be coupled to a voltage source; and
    (d) at least one voltage-drop modulation gate, fabricated between the internal drain and the drain in a non-overlapping relationship to the drain and in relation to the modulated resistance region so as to control the resistance of the modulated resistance region in response to an applied bias voltage;
    wherein the gate of the transistor structure does not overlap the modulated resistance region.

2. The invention of claim 1, wherein the breakdown voltage of the at least one voltage-drop modulation gate is greater than the breakdown voltage of the transistor structure.

3. The invention of claim 1, configured such that a sufficient bias voltage applied to the at least one voltage-drop modulation gate will drop an applied voltage on the drain to less than a breakdown voltage $BV_{DSS}$ of the FET transistor structure.

4. The invention of claim 1, wherein when the applied bias voltage is sufficiently negative with respect to a threshold voltage for the modulated resistance region, the modulated resistance region is essentially fully depleted and substantially pinches off current flow through the modulated resistance region.

5. The invention of claim 1, further including a plurality of voltage-drop modulation gates series-connected between the internal drain and the drain.

6. The invention of claim 5, wherein the plurality of voltage-drop modulation gates are configured to be biased in a step-wise fashion to achieve a total voltage drop on the FET transistor structure of less than a breakdown voltage $BV_{DSS}$ of the FET transistor structure without imposing an input voltage on any one voltage-drop modulation gate that exceeds a breakdown voltage $BV_{DSS}$ for such voltage-drop modulation gate.

7. The invention of claim 1, further including a silicide layer formed on surface regions of the modulated resistance region adjacent the at least one voltage-drop modulation gate.

8. The invention of claim 1, wherein the at least one voltage-drop modulation gate is fabricated over a portion of the modulated resistance region, and surface regions of the modulated resistance region adjacent to the at least one voltage-drop modulation gate are doped with a material having the second polarity and at a higher doping concentration than the portion of the modulated resistance region under the at least one voltage-drop modulation gate.

9. The invention of claim 1, wherein the modulated resistance region and the source and the drain comprise semiconductor regions of the second polarity, and the modulated resistance region is doped to at least about 2 orders of magnitude less than the source and drain.

10. The invention of claim 1, wherein the integrated circuit high voltage switching device is fabricated on a silicon-on-insulator substrate using a CMOS process.

11. The invention of claim 1, configured such that a sufficient bias voltage applied to the at least one voltage-drop modulation gate causes the voltage presented at the internal drain to be less than a breakdown voltage of the transistor structure.

12. The invention of claim 1, wherein when the applied bias voltage is sufficiently positive with respect to a threshold voltage for the modulated resistance region, the modulated resistance region is essentially fully depleted and substantially pinches off current flow through the modulated resistance region.

13. The invention of claim 1, wherein when the applied bias voltage is sufficiently different in magnitude with respect to a threshold voltage for the modulated resistance region, the modulated resistance region is essentially fully depleted and substantially pinches off current flow through the modulated resistance region.

14. At least one integrated circuit high voltage switching device, including:
  (a) a transistor structure including a source formed within an integrated circuit active layer region and having a first doping level, an internal drain formed within the integrated circuit active layer region and having a second doping level, a channel formed within the integrated circuit active layer region between the source and the internal drain and having a third doping level, and a gate formed over only the channel and spanning between the source and the internal drain;
  (b) a modulated resistance region co-fabricated with the transistor structure and comprising a second integrated circuit active layer region having a fourth doping level different from the third doing level, the modulated resistance region being electrically connected to the internal drain of the transistor structure; and spaced at a first edge from the channel by the internal drain;
  (c) a drain formed within the integrated circuit active layer region and having a fifth doping level, the drain being electrically connected to a second edge of the modulated resistance region and configured to be coupled to a voltage source; and
  (d) at least one voltage-drop modulation gate, fabricated between the internal drain and the drain in relation to the modulated resistance region so as to control the resistance of the modulated resistance region in response to an applied bias voltage;
  wherein the source, the drain, and the modulated resistance region are doped with a first polarity material but the fourth doping level of the modulated resistance region is less than the first doping level of the source and the fifth doping level of the drain; and
  wherein the gate of the transistor structure does not overlap the modulated resistance region.

15. The invention of claim 14, wherein the fourth doping level of the modulated resistance region is at least about 2 orders of magnitude less than the first doping level of the source and the fifth doping level of the drain.

16. The invention of claim 14, wherein the first polarity material is N-type material.

17. The invention of claim 14, wherein the breakdown voltage of the at least one voltage-drop modulation gate is greater than the breakdown voltage of the transistor structure.

18. The invention of claim 14, configured such that a sufficient bias voltage applied to the at least one voltage-drop modulation gate will drop an applied voltage on the drain to less than a breakdown voltage $BV_{DSS}$ of the FET transistor structure.

19. The invention of claim 14, wherein when the applied bias voltage is sufficiently negative with respect to a threshold voltage for the modulated resistance region, the modulated resistance region is essentially fully depleted and substantially pinches off current flow through the modulated resistance region.

20. The invention of claim 14, further including a plurality of voltage-drop modulation gates series-connected between the internal drain and the drain.

21. The invention of claim 20, wherein the plurality of voltage-drop modulation gates are configured to be biased in a step-wise fashion to achieve a total voltage drop on the FET transistor structure of less than a breakdown voltage $BV_{DSS}$ of the FET transistor structure without imposing an input voltage on any one voltage-drop modulation gate that exceeds a breakdown voltage $BV_{DSS}$ for such voltage-drop modulation gate.

22. The invention of claim 14, further including a silicide layer formed on surface regions of the modulated resistance region adjacent the at least one voltage-drop modulation gate.

23. The invention of claim 14, wherein the at least one voltage-drop modulation gate is fabricated over a portion of the modulated resistance region, and surface regions of the modulated resistance region adjacent to the at least one voltage-drop modulation gate are doped with a material having the second polarity and at a higher doping concentration than the portion of the modulated resistance region under the at least one voltage-drop modulation gate.

24. The invention of claim 14, wherein the integrated circuit high voltage switching device is fabricated on a silicon-on-insulator substrate using a CMOS process.

25. The invention of claim 14, configured such that a sufficient bias voltage applied to the at least one voltage-drop modulation gate causes the voltage presented at the internal drain to be less than a breakdown voltage of the transistor structure.

26. The invention of claim 14, wherein when the applied bias voltage is sufficiently positive with respect to a threshold voltage for the modulated resistance region, the modulated resistance region is essentially fully depleted and substantially pinches off current flow through the modulated resistance region.

27. The invention of claim 14, wherein when the applied bias voltage is sufficiently different in magnitude with respect to a threshold voltage for the modulated resistance region, the modulated resistance region is essentially fully depleted and substantially pinches off current flow through the modulated resistance region.

* * * * *